United States Patent
Joshi et al.

(10) Patent No.: US 7,176,508 B2
(45) Date of Patent: Feb. 13, 2007

(54) TEMPERATURE SENSOR FOR HIGH POWER VERY LARGE SCALE INTEGRATION CIRCUITS

(75) Inventors: Rajiv V. Joshi, Yorktown Heights, NY (US); Sukhvinder S. Kang, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 10/899,768

(22) Filed: Jul. 27, 2004

(65) Prior Publication Data

US 2006/0024852 A1 Feb. 2, 2006

(51) Int. Cl.
*H01L 23/58* (2006.01)

(52) U.S. Cl. .......................... 257/253; 257/467; 438/14
(58) Field of Classification Search ................ 257/253, 257/467, 469; 438/14, 16, 17, 18
See application file for complete search history.

(56) References Cited

U.S. PATENT DOCUMENTS

| | | | |
|---|---|---|---|
| 5,683,569 A * | 11/1997 | Chung et al. ............... | 205/775 |
| 6,252,277 B1 | 6/2001 | Chan et al. | |
| 6,261,935 B1 | 7/2001 | See et al. | |
| 6,456,104 B1 * | 9/2002 | Guarin et al. ............... | 324/769 |
| 6,573,169 B2 | 6/2003 | Noble et al. | |
| 6,774,713 B2 * | 8/2004 | Watanabe ................... | 327/540 |
| 2003/0076153 A1 * | 4/2003 | Shakeri et al. .............. | 327/534 |
| 2004/0042529 A1 * | 3/2004 | Covi et al. .................. | 374/178 |

* cited by examiner

*Primary Examiner*—Phuc T. Dang
(74) *Attorney, Agent, or Firm*—Rafael Perez-Pineiro (57) ABSTRACT

Disclosed is a temperature sensor for an integrated circuit having at least one field effect transistor (FET) having a polysilicon gate, in which a current and a voltage is supplied to the polysilicon gate, changes in the current and the voltage of the polysilicon gate are monitored, wherein the polysilicon gate of the at least one FET is electrically isolated from other components of the integrated circuit, and the changes in the current or voltage are used to calculate a change in resistance of the polysilicon gate, and the change in resistance of the polysilicon gate is used to calculate a temperature change within the integrated circuit.

22 Claims, 11 Drawing Sheets

TEMPERATURE SENSOR FOR HIGH POWER VERY LARGE SCALE INTEGRATION CIRCUITS

FIELD OF THE INVENTION

The present invention relates to a temperature sensor embedded within a semiconductor circuit.

BACKGROUND OF THE INVENTION

High powered very large scale integration (VLSI) circuits are widely used in the electronics industry. Major uses include clock buffers, wordline drivers and I/O buffers. During their operation, VLSI circuits generate heat internally. This self-heating increases the junction temperature in the device, and can result in failure of the VLSI circuit.

Figure 1:
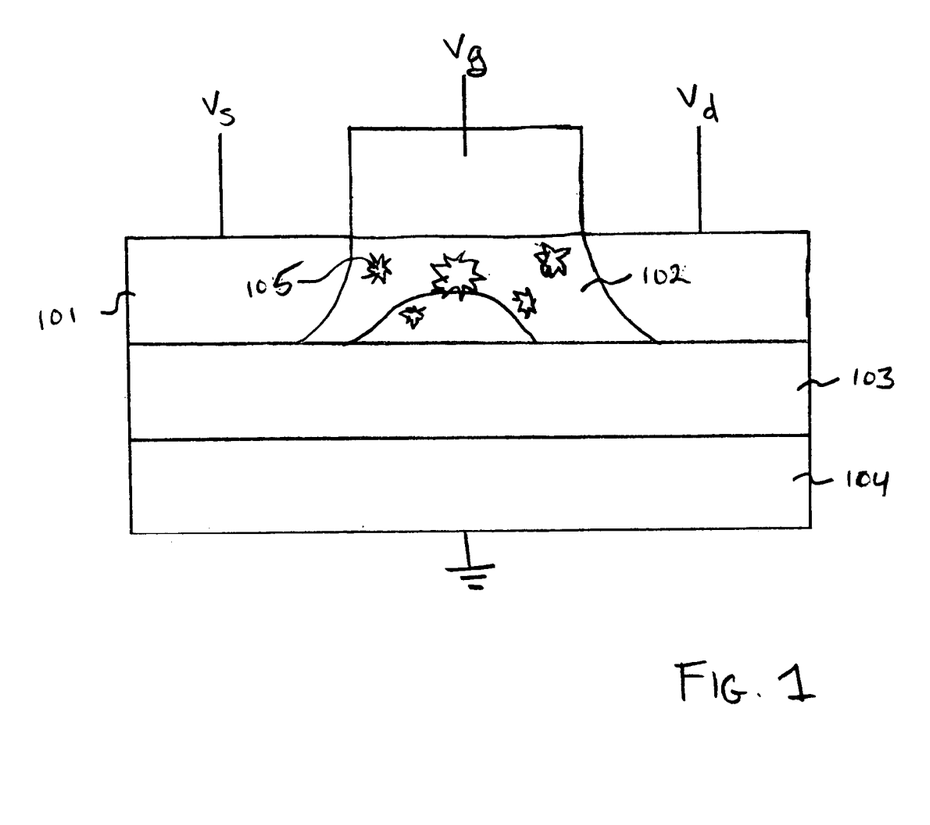
FIG. 1 is a simplified diagram of an FET showing the self-heating.

Generally, VLSIs are comprised of a plurality of field effect transistors (FETs) laid out on a substrate. FIG. 1 is a simplified diagram of an FET showing the self-heating. Shown in FIG. 1 are channel 101, gate 102, oxide 103 and substrate 104. Within the channel 101 to gate 102 junction, the self-heating is shown as bursts 105. Points where the source voltage Vs, the drain voltage Vd, and the gate voltage Vg are also shown. As the voltages are applied to the source, gate and drain of the device, internal heating begins to occur. As shown in this simplified diagram, the self-heating bursts 105 are non-uniform and in their distribution and degree.

Figure 2:
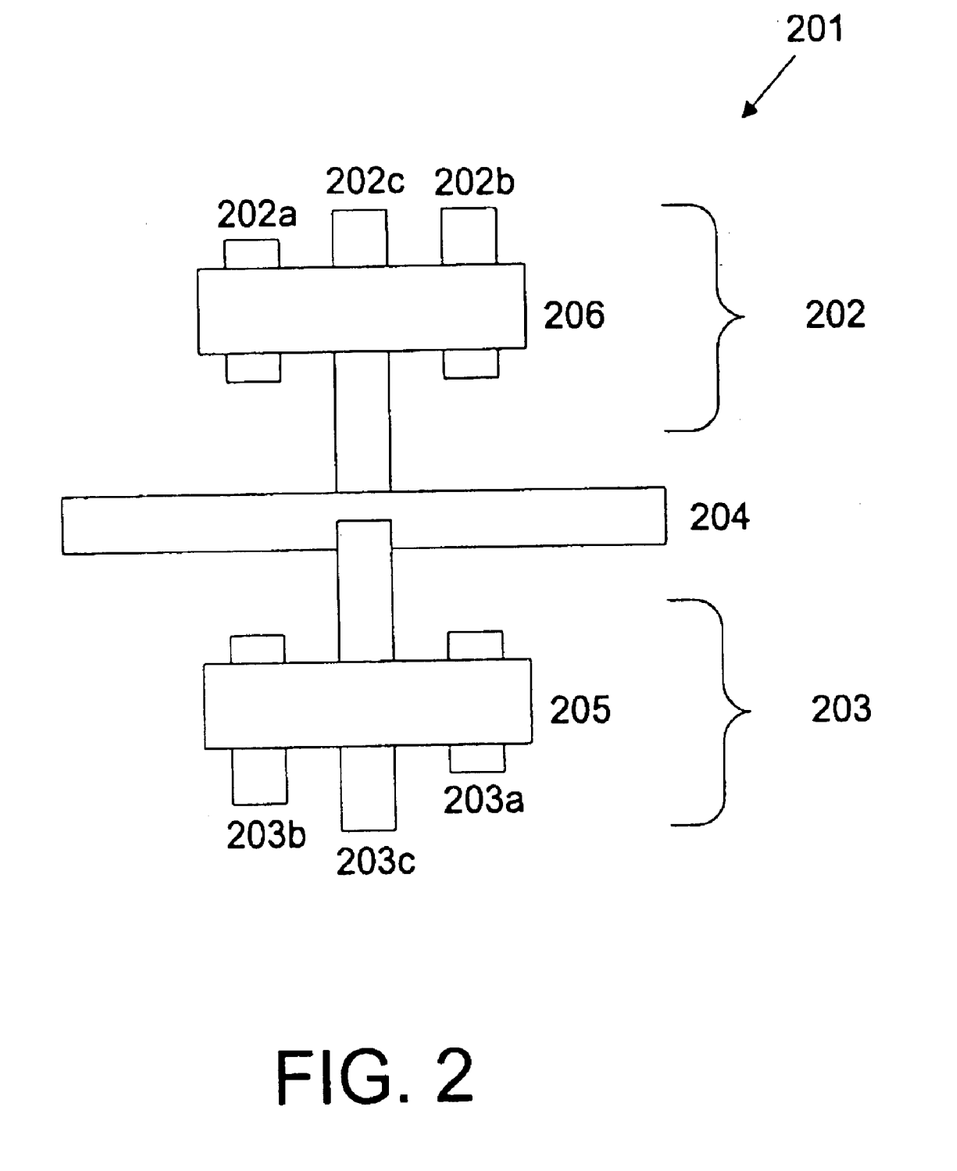
FIG. 2 is a schematic diagram illustrating a single finger VLSI circuit.

FIG. 2 is a schematic diagram illustrating a single finger VLSI circuit. Shown in FIG. 2 is a single finger VLSI 201. P junction FET (PFET) 202 and N junction FET (NFET) 203 comprise the VLSI 201 shown in FIG. 2. PFET 202 is comprised of a source 202a, a drain 202b, and a gate 202c, and NFET 203 is comprised of a source 203a, a drain 203b, and a gate 203c. Voltage (+V) 205 and Ground (GND) 206 are also depicted in FIG. 2. PFET 202 and NFET 203 are controlled through gate connector 204. The gates and gate connector are shown in a hatched detail. The gate connector 204 extends horizontally between gates 202c and 203c. The "single finger" structure of the VLSI 201 refers to the single vertical part of the gate 204. As voltages are applied to the VLSI 201, the regions about the PFET 202 and the NFET 203 will begin to generate heat due to the flow of current through each of the PFET 202 and NFET 203. As stated earlier, this heat, if allowed to reach critical values, can deteriorate ideal operation or completely destroy the VLSI 201.

Polysilicon, or polycrystalline silicon, has long been used as the conducting gate and gate connector material in MOSFET and CMOS processing technologies. For these technologies it is deposited using reactors at high temperatures. More recently, polysilicon is being used in very large scale integration (VLSI) electronics. The main advantage of polysilicon is that it allows more complex, high-speed circuitry to be created on the glass substrate.

Figure 3:
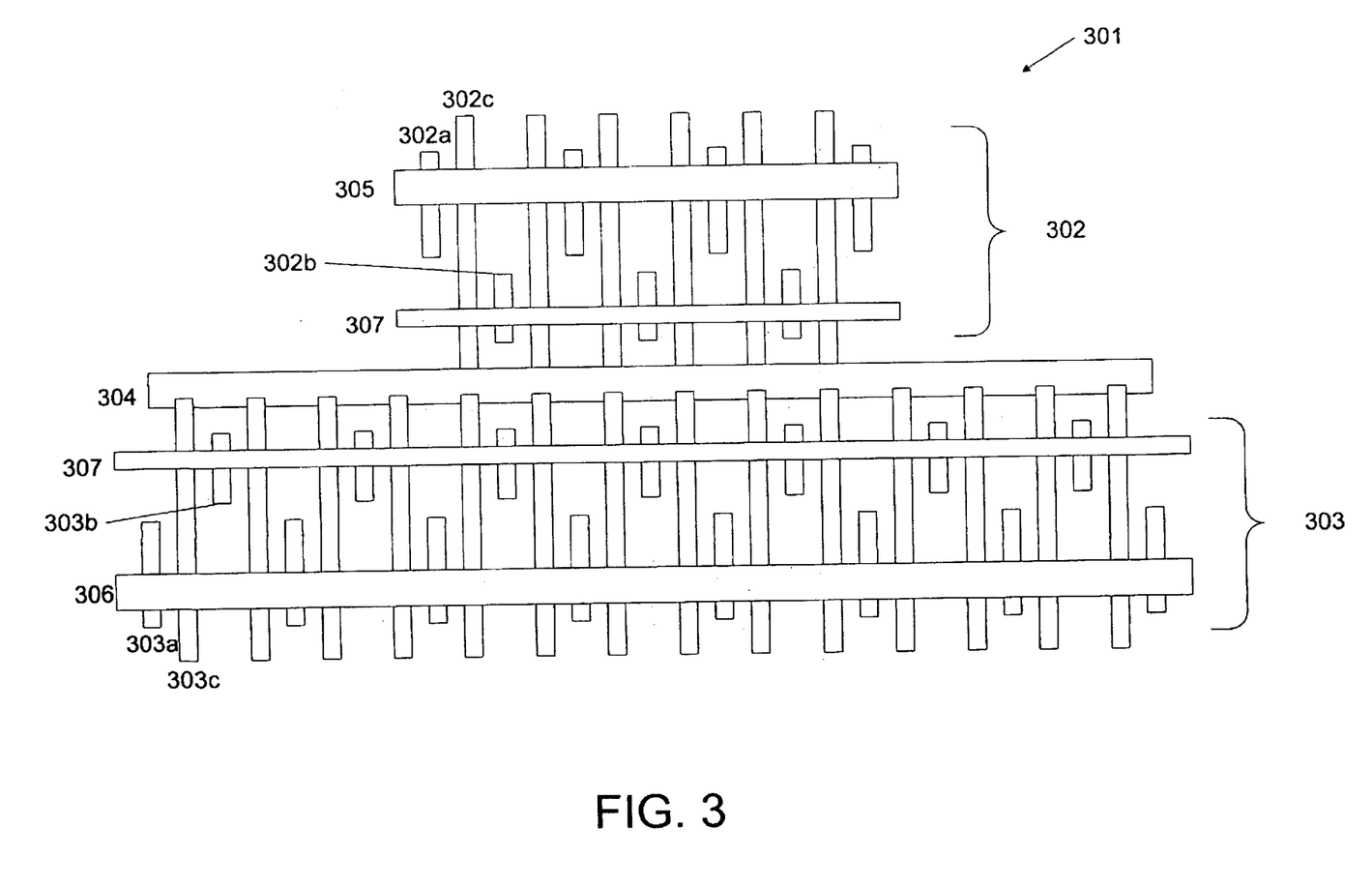
FIG. 3 is a schematic diagram illustrating a multi-finger VLSI circuit.

FIG. 3 is a schematic diagram illustrating a multi-finger VLSI circuit. Shown in FIG. 3 is a multi-finger VLSI 301. A plurality of P junction FETs (PFETs) 302 and a plurality of N junction FETs (NFETs) 303 comprise the VLSI 301 shown in FIG. 3. Each PFET 302 is comprised of a source 302a, a drain 302b, and a gate 302c, and each NFET 303 is comprised of a source 303a, a drain 303b, and a gate 303c. Voltage (+V) 305 and Ground (GND) 306 are also depicted in FIG. 3. Each PFET 302 and each NFET 303 are controlled through gate connector 304. The gates and gate connectors are shown in a hatched detail. The gate connector 304 extends horizontally between each of the FETs. Vout 307 is the output voltage points for the FETs. The "multi-finger" structure of the VLSI 301 refers to the plurality of 302c gates and plurality of 303c gates. As voltages are applied to the VLSI 301, the regions about the PFETs 302 and the NFET 303 will begin to generate heat due to the flow of current through each of the PFETs 302 and NFETs 303. As stated earlier, this heat, if allowed to reach critical values, can deteriorate ideal operation or completely destroy the VLSI 301.

Currently, various models are utilized to estimate this internally generated heat. One such model is the Berkeley Short-channel IGFET Model for MOS transistors (BSIM). The BSIM and other design models approximate the internal operations of a circuit at a design stage. These models use know values and operating parameters of the circuit components to assist in the design of the final integrated circuit using highly mathematical statistical models. The BSIM in particular also includes statistical models to estimate the internal heating of the integrated circuit. Although the BSIM is a good method to approximate the internal temperature of the integrated circuit, using approximations and statistical models can only produce estimated results.

During the operational states of the circuits, the self-heating is also know to be non-uniform throughout the topology of the circuit. Again, only approximations and estimations are available to measure the differences in temperature occurring at these differing levels of the integrated circuit. As a result, the integrated circuits that are designed using the conventional methods cannot accurately account for the variations in temperature throughout the cross sections of the final integrated circuit product.

SUMMARY OF THE INVENTION

One of the main shortcomings of the conventional temperature measurement systems is their lack for accurately measuring the real-time internal temperature of an integrated circuit. There are no current solutions to this problem.

An object of the present invention is to substantially solve at least the above problems and/or disadvantages and to provide at least the advantages below.

Accordingly, an object of the present invention is to provide a system for measuring internal temperatures of high-powered VLSI circuits.

Another object of the present invention is to provide a system to assist in the design of integrated circuits independent of the conventional self-heating models.

Another object of the present invention is to provide a system to identify circuit topologies prone to self-heating.

A further object of the present invention is to provide a system to improve thermal model-to-hardware correlation.

It is still a further object of the present invention is to provide a system for assessing thermal impact on an integrated circuit device performance.

The above and other objects and aspects are made possible by a temperature sensor for an integrated circuit having at least one field effect transistor (FET) having a polysilicon gate, comprising means for supplying a current and a voltage to the polysilicon gate; and means for monitoring changes in the current and the voltage of the polysilicon gate, wherein the polysilicon gate of the at least one FET is electrically isolated from other components of the integrated circuit, and wherein the changes in the current or voltage are used to calculate a change in resistance of the polysilicon gate, and wherein the change in resistance of the polysilicon gate is used to calculate a temperature change within the integrated circuit.

Another object of the present invention is to embed a thermometer within on-chip clock buffers, I/O drivers, wordline drivers, latches, etc.

BRIEF DESCRIPTION OF THE DRAWINGS

The foregoing and other objects, aspects, and advantages of the present invention will be better understood from the following detailed description of preferred embodiments of the invention with reference to the accompanying drawings that include the following.

DETAILED DESCRIPTION OF THE PREFERRED EMBODIMENT

Several preferred embodiments of the present invention will now be described in detail herein below with reference to the annexed drawings. In the drawings, the same or similar elements are denoted by the same reference numerals even though they are depicted in different drawings. In the following description, a detailed description of known functions and configurations incorporated herein has been omitted for conciseness.

One of the main shortcomings of the conventional temperature measurement systems is their lack for accurately measuring real-time internal temperatures at varying layers of an integrated circuit. The novel system for measuring internal temperatures of high-powered VLSI circuits disclosed herein provides a solution for these shortcomings.

As stated earlier, self-heating in integrated circuits intricately affects the design, construction and performance of the final product. Great amounts of time and money are spent correcting and preventing the failures of the integrated circuits due to the internal heating. Complex cooling apparatus are used as a heating prevention method, but these cooling apparatus are not accurately targeted to the specific heating zones of the integrated circuit since, prior to the present invention, not accurate measurement system was available.

Figure 4:
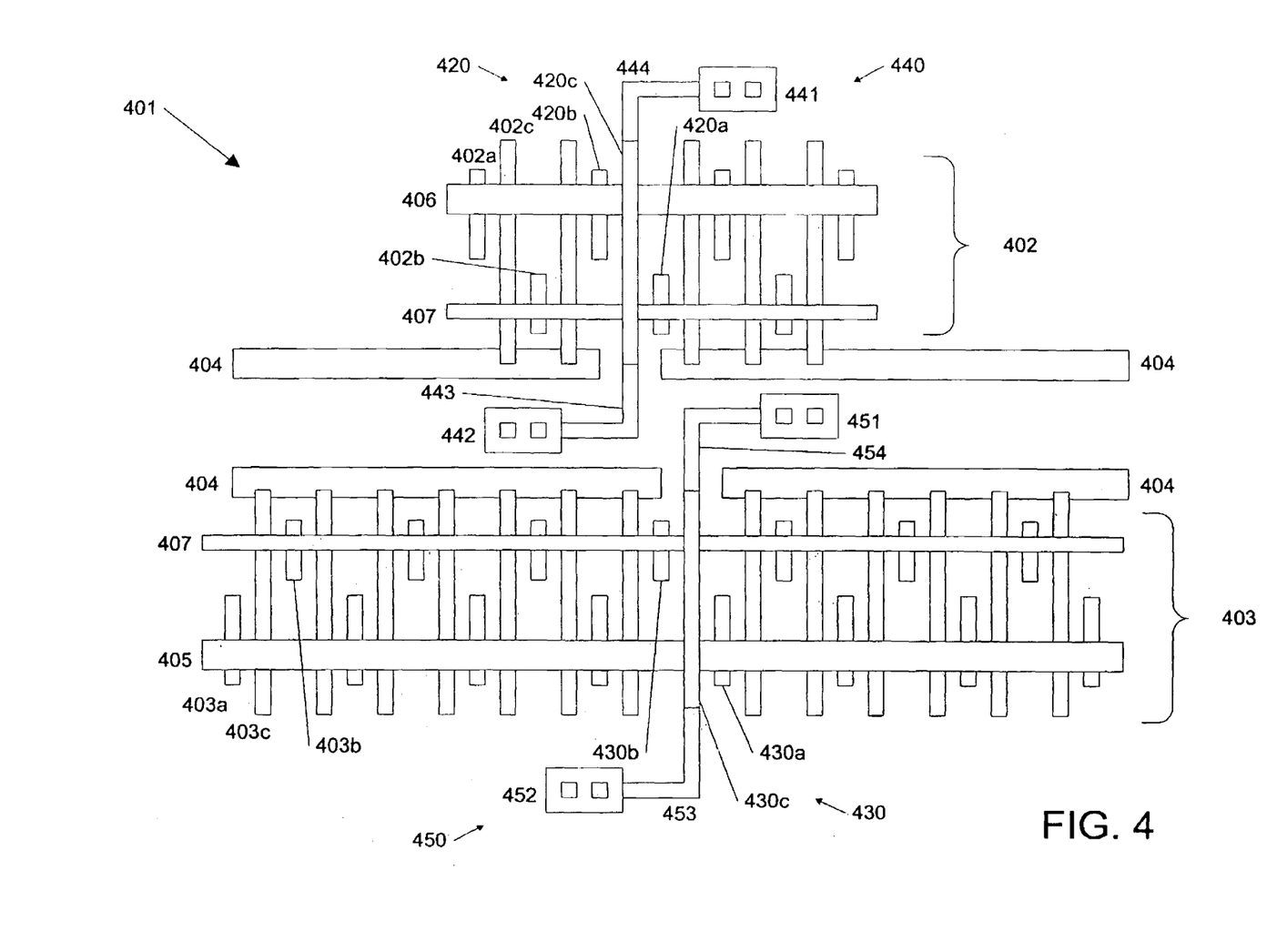
FIG. 4 is a schematic diagram of a multi-finger VLSI circuit according to an embodiment of the present invention.

FIG. 4 is a schematic diagram of a multi-finger VLSI circuit according to an embodiment of the present invention. Shown in FIG. 4 is a multi-finger VLSI 401. A plurality of P junction FETs (PFETs) 402 and a plurality of N junction FETs (NFETs) 403 comprise the VLSI 401 shown in FIG. 4. Each PFET 402 is comprised of a source 402a, a drain 402b, and a gate 402c. Each NFET 403 is comprised of a source 403a, a drain 403b, and a gate 403c. Voltage (+V) 405 and Ground (GND) 406 are also depicted in FIG. 4. Each gate of each PFET 402 and each NFET 403 are controlled through gate connector 404. The gates and gate connector are shown in a hatched detail. The gate connector 404 connects to each gate of the PFETs 402 and NFETs 403, and extends horizontally between them. Vout 407 is the output voltage points for the FETs. Additionally shown in FIG. 4 are PFET 420, comprised of a source 420a, a drain 420b, and a gate 420c, and NFET 430, comprised of a source 430a, a drain 430b, and a gate 430c.

As can be seen in FIG. 4, each of gate 420c and gate 430c has been isolated from the gate connector 404. Also each end of gates 420c and 430c has been extended by gate extenders 443, 444, 453 and 454. Connected to gate extender 444 is a probe point 441, and connected to gate extender 443 is a probe point 442. Connected to gate extender 454 is a probe point 451, and connected to gate extender 453 is a probe point 452. Gate 420c and gate extenders 443 and 444, comprise temperature sensor 440. Gate 430c and gate extenders 453 and 454, comprise temperature sensor 450. PFET 420 and NFET 430 become inactive when their respective gates 420c and 430c are utilized as temperature sensors. This loss of a single PFET and a single NFET in the VLSI 401 produces a minimal impact on the operation of the VLSI 401, but greatly increases the use of the gates for the temperature sensors.

The operation of a temperature sensor according to the present invention will now be described with reference to FIG. 4. The following description of the present invention will be limited to temperature sensor 440, although the description also applies to temperature sensor 450.

It is well known in the art that the electrical resistance of a conductor changes with temperature. The 3-dimensional Poisson's equation $$\nabla \lambda \nabla T + q = 0 \qquad (1)$$

where T is the temperature, q is the heat/volume, and λ is the thermal conductivity, can be used to analyze and determine the temperature change. By determining the thermal conductivity of the isolated gate finger, i.e. gate 420c, the change in temperature can be calculated, by solving Equation (1) for T $$\nabla T = \frac{-q}{\nabla \lambda} \qquad (2)$$

The probe points 441 and 442 provide access points to the temperature sensor 440 to supply a voltage and a current through the gate 420c of the temperature sensor 440, and measure the voltage across the temperature sensor 440, and measure the current through the temperature sensor 440. The resistance of the temperature sensor 440 is calculated by the following Equation 3

$$R = \frac{V}{I} \qquad (3)$$

where R is the calculated resistance, V is the measured voltage, and I is the measured current.

There are two methods for calibrating the temperature sensor 440. First, the resistance of the temperature sensor 440 can be calibrated as a function of the chuck temperature. Second, the resistance of the temperature sensor 440 can be calibrated as a function of the sub-threshold leakages. Whichever method is utilized, and other calibration techniques are of course contemplated, a calibration of the temperature sensor is needed to ensure proper temperature measurements.

Four main temperature test procedure modes are available through the use of the novel temperature sensor disclosed herein. The four modes are as follows: mode 1—all gates active (i.e. all of the gates and the temperature sensor (i.e. the gates 420c and 430c of the temperature sensors 440 and 450, respectively) are active); mode 2—only the temperature sensor is active; mode 3—all gates are active and the temperature sensor is inactive; and mode 4—all gates inactive (all gates and the temperature sensor are inactive). The temperature sensor gate is considered inactive when no current or voltage is introduced through its gate element. Each of the four modes of operation will now be described in further detail. Mode 1 determines the temperature of the integrated circuit while all of the gates of all of the PFETs and NFETs are active, and the temperature sensor is active. This first mode of all gates active determines the highest level of internal heating that will occur in the integrated circuit. Mode 2 determines the internal heat generated while only the temperature sensor gate is active, and can be used as a calibration temperature. Mode 3 measures the current and voltage of the temperature sensor while all of the other gates are active, but no current and voltage is being applied to the temperature sensor. This mode allows for any leakage currents and voltages to be measured, and can be used in calibration procedures. Mode 4 measures the current and voltage of the temperature sensor while all of the gates are inactive, including the temperature sensor gate.

In addition to the above embodiment of the present invention, temperature measurements attained through the determination of sub-threshold leakage currents can also be obtained using the temperature sensor according to the embodiment of the present invention. The leakages through these devices can be measured using a similar four pad temperature sensor structure as previously described. It is well known that the sub-threshold current leakages of integrated circuit elements are related to the temperature, as shown by the following Equation 4

$$I = I_0(e^{(Vq/kT)} - 1) \quad (4)$$

where V is the applied voltage, T is the temperature, q is the electron charge, and $I_0$ is the saturation current. The current-voltage characteristics can be obtained for the leakages and the temperature can be extrapolated from the obtained leakage characteristics especially from the sub-threshold leakages.

Figure 11:
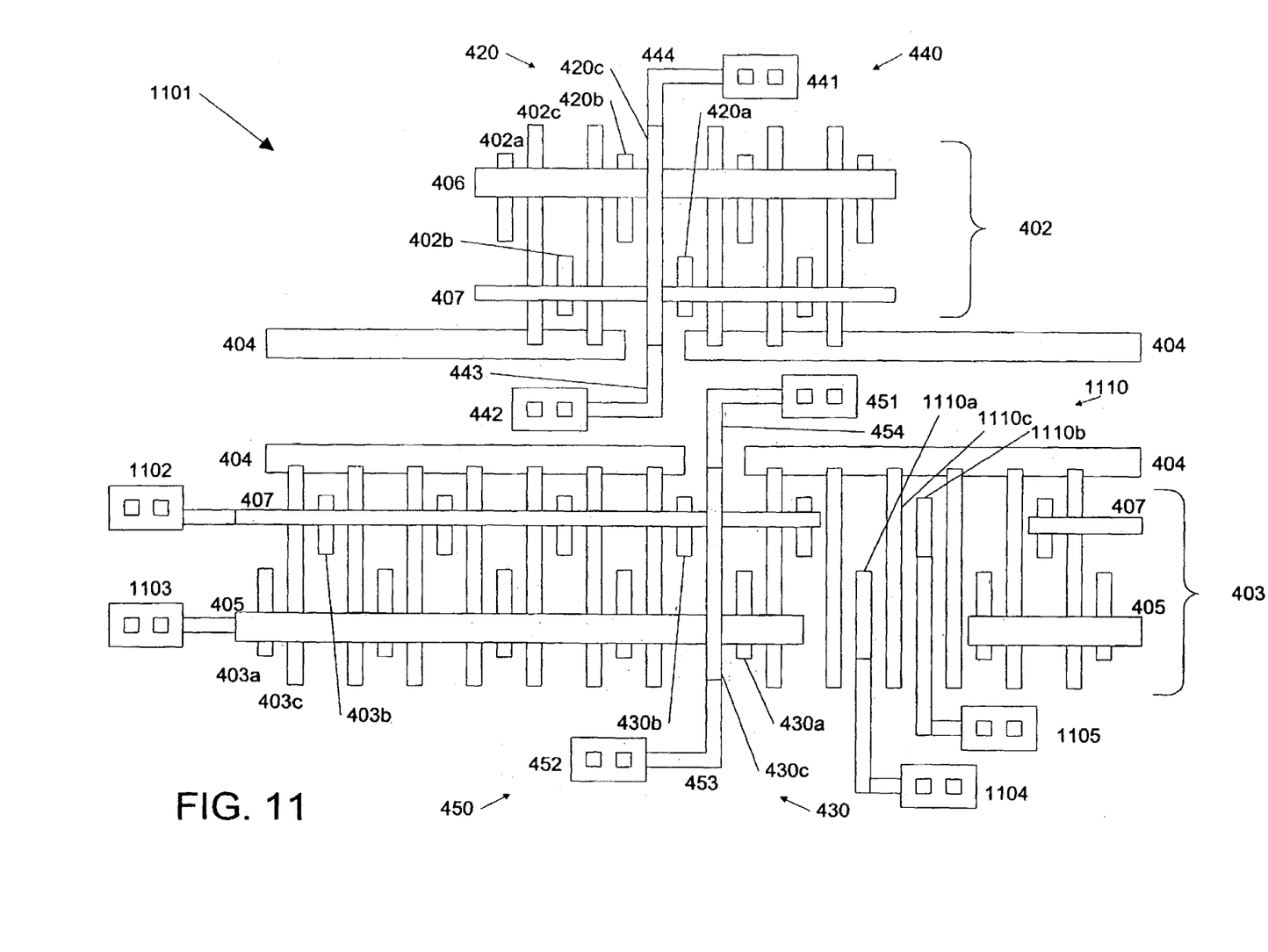
FIG. 11 is a diagram illustrating an integrated circuit configuration for determining the temperature at sub-threshold operating conditions according to additional embodiments of the present invention.

FIG. 11 is a diagram illustrating an integrated circuit configuration for determining the temperature at sub-threshold operating conditions according to additional embodiments of the present invention. Many of the elements shown in FIG. 11 are similar to those in FIG. 4, and as such, the duplicative elements will not be described herein. Integrated circuit 1101 is shown in FIG. 11. In addition to the embodiment shown in FIG. 4, two additional embodiments are shown in FIG. 11; a second embodiment for determining the sub-threshold leakage current between the sources and the drains of the FETs of the integrated circuit, and a third embodiment for determining the sub-threshold leakage current between a single source and a single drain of one FET of the integrated circuit. As will be shown and described, intermediate variations are contemplated, namely, the leakage current of any number of the FETs, from one to all, can be determined using this method. The temperature can then be determined from the slope of the plot of the Vq/kT term.

The new elements of the second embodiment include current pad 1102 and current pad 1103. By placing the FETs into a sub-threshold state by applying the proper voltages to Voltage 405 and Vout 40, the sub-threshold leakage current between the sources and the drains can be measured at pads 1102 and 1103. Then the temperature can be determined by calculating the slope of the line formed by the plot of Vq/kT.

The third embodiment PFET 1110 is shown comprising source 1110a, drain 1110b, and gate 1110c. Generally, it is noted that PFET 1100 has been electrically isolated from Voltage 405 and Vout 407. Connected to source 1110a is pad 1104, and connected to drain 1110b is pad 1105. In this embodiment, the leakage current of the single PFET 1110 can be determined by placing the PFET 1110 into a sub-threshold state by applying the proper voltages to pads 1104 and 1105, the sub-threshold leakage current between the source 1110a and the drain 1110b can be measured at pads 1104 and 1105. Then the temperature can be determined by calculating the slope of the line formed by the plot of Vq/kT.

Figure 5:
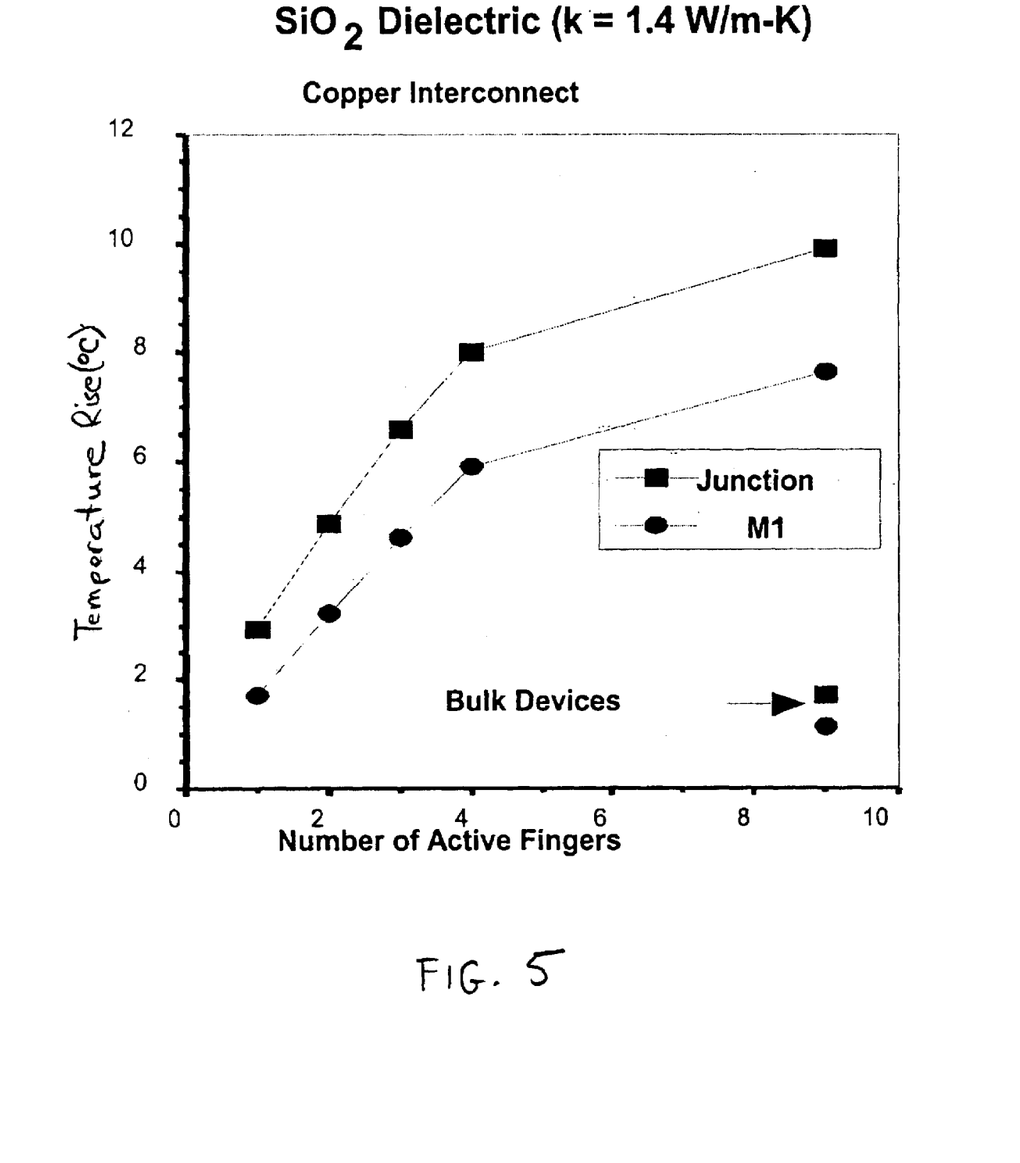
FIG. 5 is a chart illustrating the effect of multiple active fingers.

FIG. 5 is a chart illustrating the effect of multiple active fingers. Shown in FIG. 5 are the junction and layer M1 temperature rises. As can be seen, an increase in the active number of fingers increases the junction temperature. Also, a close thermal coupling between the fingers within the same body increases the thermal resistance by three times.

Figure 6:
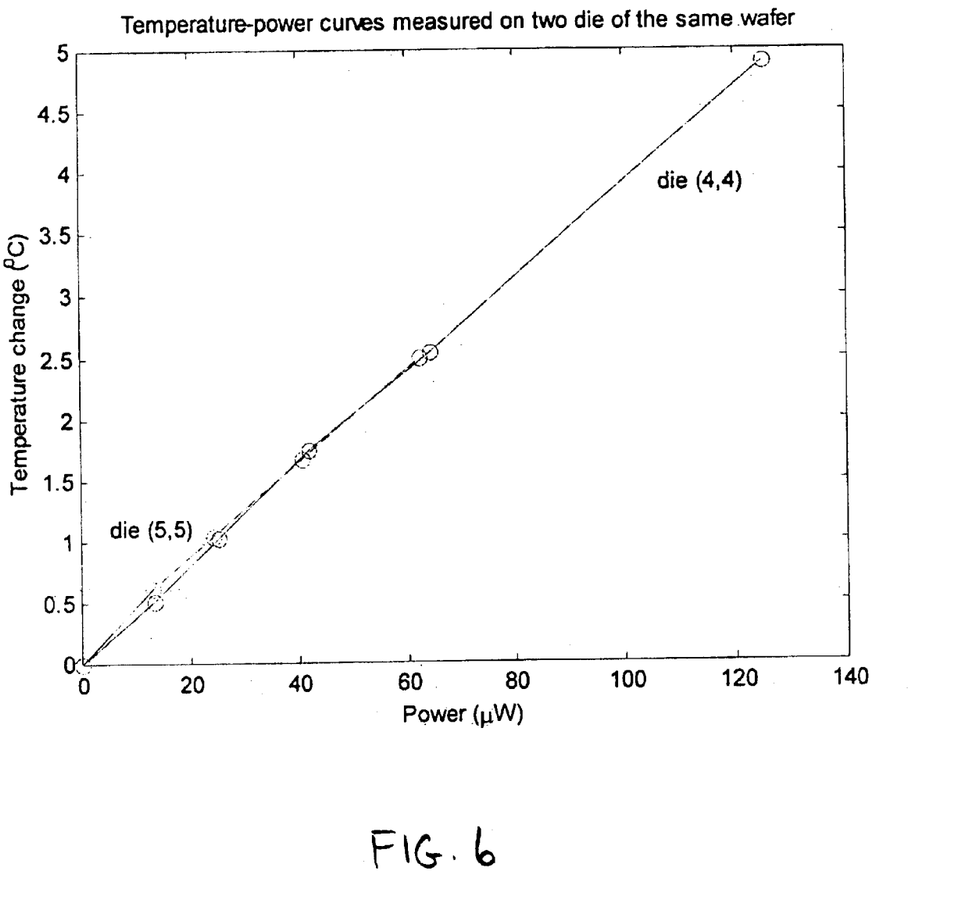
FIG. 6 is a graph illustrating the die-to-die variation when only the sensor is active.

FIG. 6 is a graph illustrating the die-to-die variation when only the sensor is active. As the power increases, the temperature change increases almost linearly.

The following tables illustrate thermal resistance data as determined according to the present invention. In the following tables, the temperature sensors are located at two different FET locations, and listed in the tables as "1" or "2". Also, the conditions of the device are as follows: "A" denotes that only the sensor gate is active during temperature measurements; "B" denotes that all of the gates are active during temperature measurements; and "C" denotes that all of the gates except for the sensor gate are active during temperature measurements.

TABLE 1

| Gate Conditions | 0.13 micron technology (degrees C/mW) | 0.09 micron technology (degrees C/mW) | 0.09 micron | 0.09 micron |
|---|---|---|---|---|
| 1A | 18.5 | 24.2 | | |
| 1B | 4.9 | 5.8 | | |
| 1C | 2.6 | 2.6 | | |
| 2A | 16.1 | 22.6 | 39 | 41 |
| 2B | 2.0 | 1.8 | 4.4 | 4.7 |
| 2C | 1.1 | 0.9 | | 3.2 |

TABLE 2

| Gate Conditions | 0.13 micron technology (degrees C-micrometer/mW) | 0.09 micron technology (degrees C-micrometer/mW) |
|---|---|---|
| 1A | 49.40 | 64.61 |
| 1B | 104.66 | 123.89 |
| 1C | 48.59 | 48.59 |
| 2A | 42.99 | 60.34 |

TABLE 2-continued

| Gate Conditions | 0.13 micron technology (degrees C-micrometer/mW) | 0.09 micron technology (degrees C-micrometer/mW) |
| --- | --- | --- |
| 2B | 149.52 | 134.57 |
| 2C | 79.30 | 64.88 |

Figure 7:
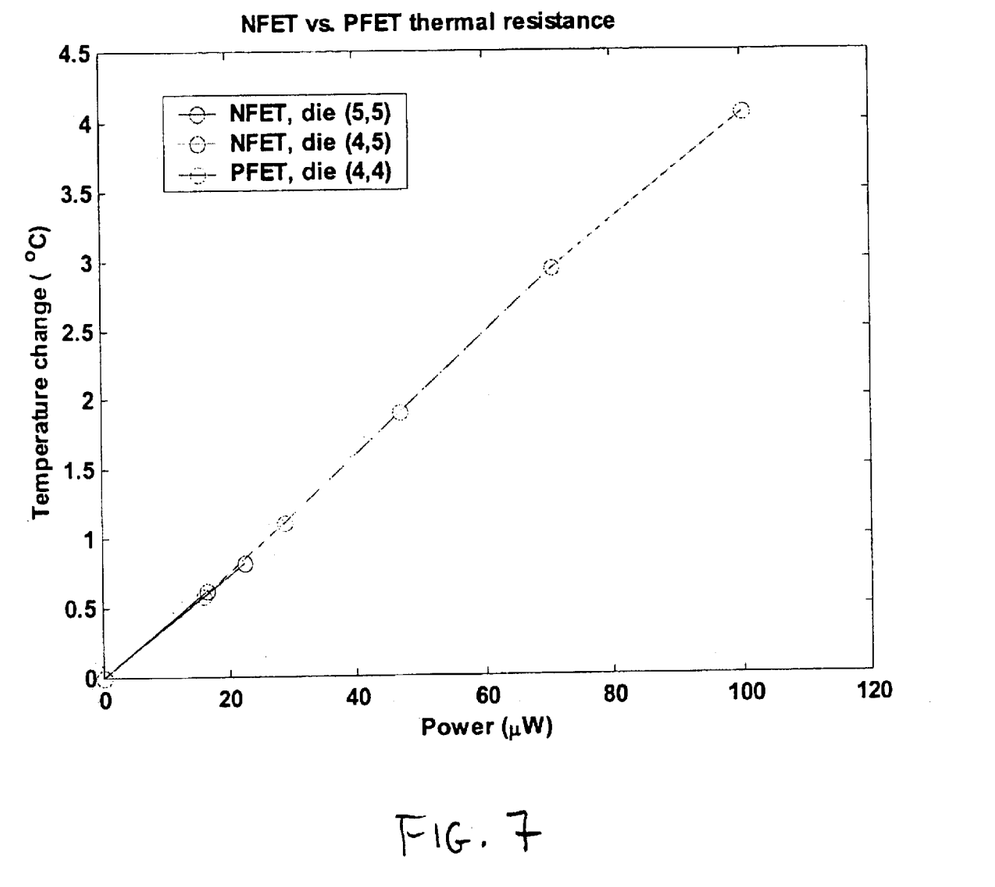
FIG. 7 is a graph illustrating the thermal resistance of a NFET versus a PFET.

FIG. 7 is a graph illustrating the thermal resistance of a NFET versus a PFET. During the temperature measurements, only the sensor gate was active. Also, the gate, the source and the drain voltages were all equal.

Figure 8:
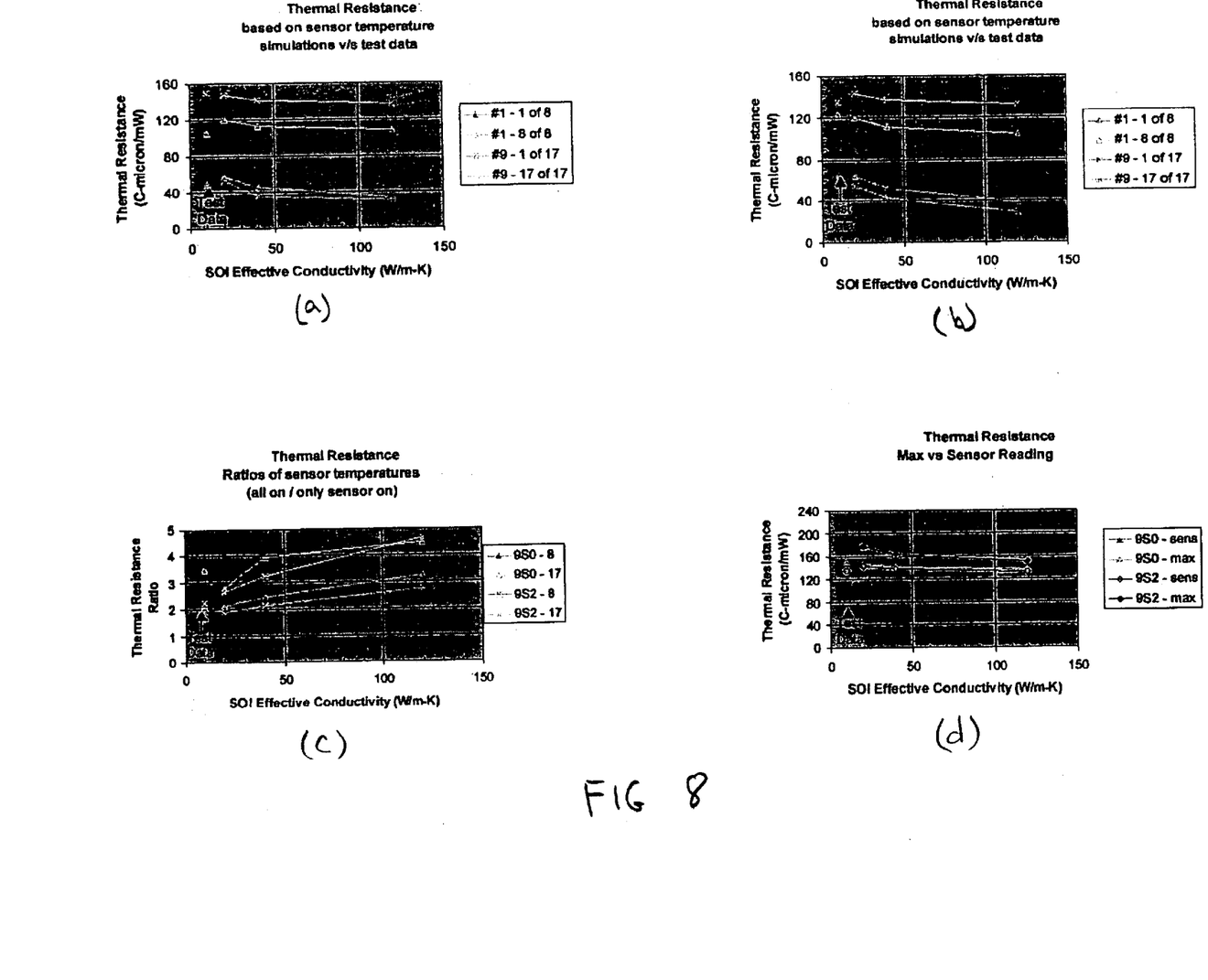
FIG. 8 illustrates four different thermal resistances versus conductivity graphs.

FIG. 8 illustrates four different thermal resistances versus conductivity graphs. Diagram (a) of FIG. 8 illustrates the thermal resistance based on the temperature of the sensor versus standard test data of 0.13 micron technology. Diagram (b) of FIG. 8 illustrates the thermal resistance based on the temperature of the sensor versus standard test data of 0.09 micron technology. Diagram (c) of FIG. 8 illustrates the thermal resistance ratios of the temperature of the sensors in an all on versus only the sensor on of 0.13 micron technology. Diagram (d) of FIG. 8 illustrates the thermal resistance of maximum versus sensor readings of 0.13 micron technology.

Figure 9:
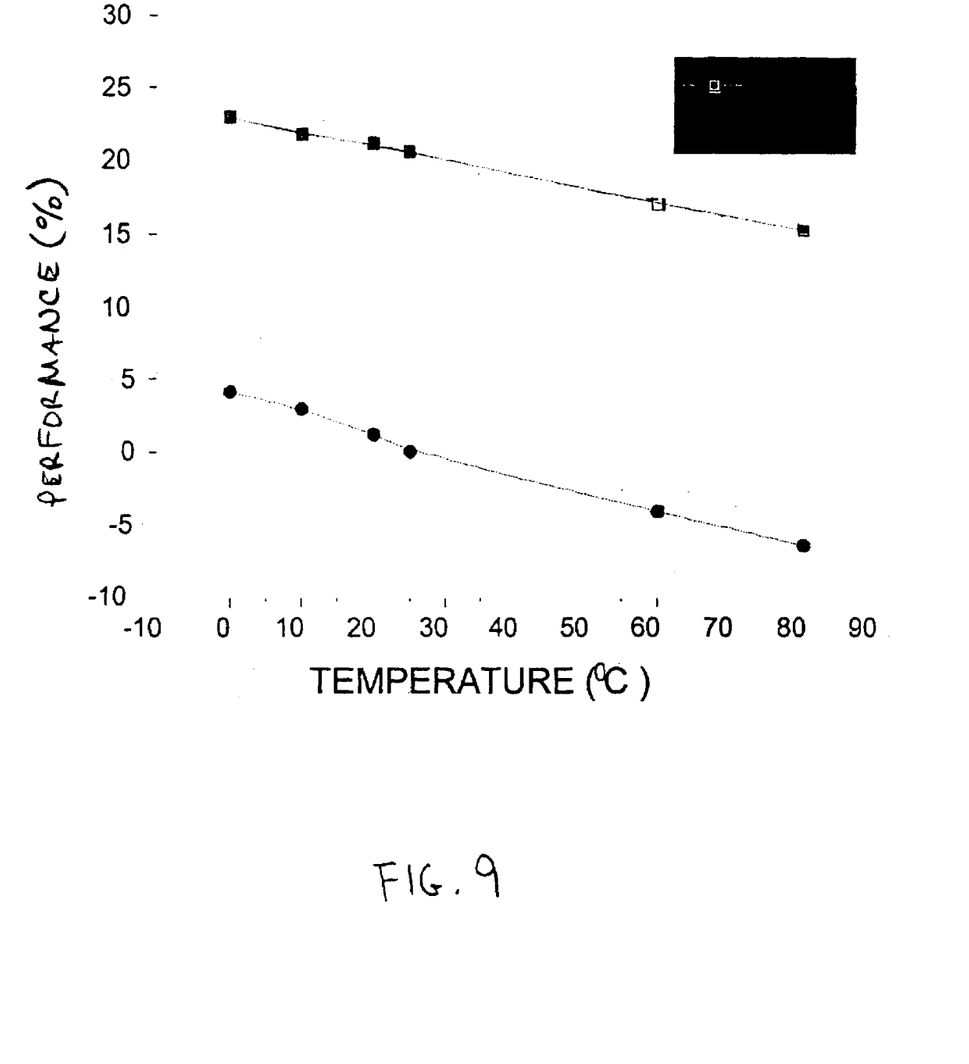
FIG. 9 is a graph illustrating performance versus temperature of a clock buffer.

FIG. 9 is a graph illustrating performance versus temperature of a clock buffer. The graph is shown scaled to a bilk performance at 25 degrees Celsius. The performance gain of the SOI is 20% greater than the bulk. The performance change is 1.2% per 10 degrees Celsius for the SOI, and 1.32% per 10 degrees Celsius for the bulk.

Figure 10:
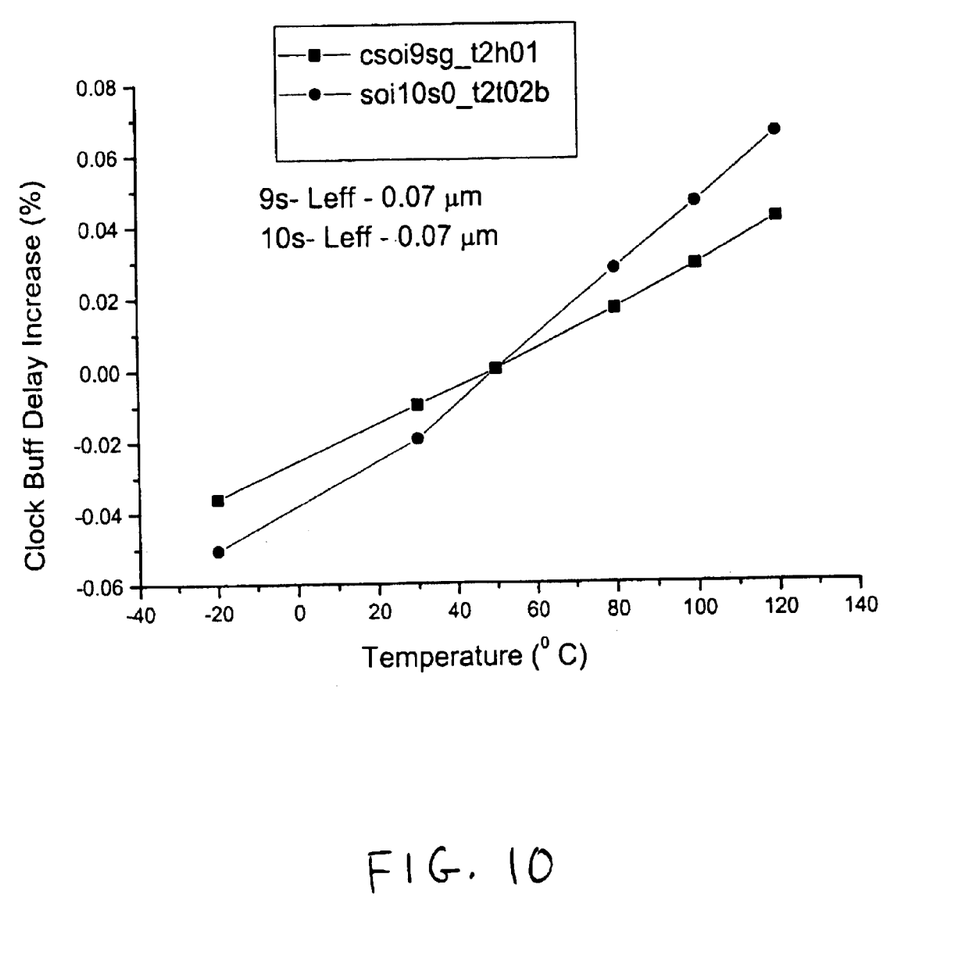
FIG. 10 is a graph illustrating performance versus temperature.

FIG. 10 is a graph illustrating performance versus temperature. As can be seen the delay increases as the temperature increases of the two technologies shown in FIG. 10.

Similar methodology, that is a four point probe structure at the end of metal lines wherein the two top pads are used for voltage and current and the two bottom pads are used for voltage and current, can be used for measuring the temperature of metal lines by calibrating the resistance of the metal lines connected to a device or a circuit.

Also in both methodologies individual devices can be separated in the multifinger topology and source and drain current can be separately tapped off in the sub-threshold regime. The spacing of the devices can also be varied to study the temperature rise based on the leakage data based on various spacing designs.

It is also contemplated that both of the structures can be used in planar or in 3-D plane topology.

In summary, the present invention provides a system for measuring internal temperatures of high-powered VLSI circuits, can vitally assist in the design of integrated circuits independent of the conventional self-heating models, is able to identify circuit topologies prone to self-heating, can improve thermal model-to-hardware correlation, enables the assessing thermal impact on an integrated circuit device performance, can greatly assist in the design of integrated circuits independent of the conventional self-heating models, and can greatly improve the thermal model-to-hardware correlation.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A temperature sensor for an integrated circuit having at least one field effect transistor (FET), said FET having a gate, comprising means for monitoring changes in the current and the voltage of the gate,
    wherein the gate of the at least one FET is electrically isolated from other components of the integrated circuit, and wherein the changes in the current and voltage are used to calculate a change in resistance of the gate, and wherein the change in resistance of the gate is used to calculate a temperature change within the integrated circuit.

2. The temperature sensor of claim 1, further comprising means for supplying a current and a voltage to the polysilicon gate.

3. The temperature sensor of claim 2, wherein the resistance of the gate is measured while the other elements of the integrated circuit are in an inactive state to determine a temperature during the inactive state.

4. The temperature sensor of claim 2, wherein the resistance of the gate is measured while the other elements of the integrated circuit are in an active state to determine a temperature during the active state.

5. The temperature sensor of claim 1, wherein the temperature sensor is embedded within at least one of an on-chip clock buffer, an IO driver and a wordline driver.

6. The temperature sensor of claim 1, wherein the temperature sensor is employed in multilevel metallization.

7. The temperature sensor of claim 1, wherein the temperature sensor is comprised of a multifinger device with different device spacing and separate source-drain connections.

8. The temperature sensor of claim 1, wherein the temperature sensor is employed in 3-D topology structures.

9. An integrated circuit having an embedded temperature sensor, comprising:
    at least one field effect transistor (FET), said FET having a gate that is electrically isolated from other elements of the integrated circuit;
    a voltage monitoring point to monitor the voltage of the gate; and
    a current monitoring point for monitoring the current through the gate.

10. The temperature sensor of claim 9, further comprising:
    a voltage input point for supplying a voltage to the gate; and
    a current input point for supplying a current through the gate.

11. A method for measuring the internal temperature of an integrated circuit having at least one field effect transistor (FET) having a gate, comprising the steps of:
    electrically isolating the gate from other elements of the integrated circuit;
    measuring the current and voltage of the gate;
    calculating the resistance of the gate based on the measured current and voltage; and
    calculating the temperature of the gate based on the calculated resistance.

12. The method for measuring the internal temperature of an integrated circuit of claim 11, wherein a voltage is supplied to the gate and a current is supplied through the gate.

13. The method for measuring the internal temperature of an integrated circuit of claim 11, wherein lateral heat spreading can be calculated in multifinger devices.

14. A temperature sensor for an integrated circuit having at least one field effect transistor (FET) having a source, a drain and a gate, and having a channel between the source and the drain, comprising means for monitoring changes in sub-threshold leakage currents through the channel, wherein the temperature is extrapolated from the obtained leakage currents.

15. The temperature sensor of claim 14, wherein the leakage currents are proportional to $$I = I_0(e^{(Vq/kT)} - 1)$$

where V is the applied voltage, T is the temperature, q is the electron charge, and $I_0$ is the saturation current.

16. The temperature sensor of claim 14, further comprising:
    a first source of at least one FET electrically isolated from other components of the integrated circuit;
    a first drain of the at least one FET electrically isolated from other components of the integrated circuit;
    means for supplying a voltage to at least one of the first source and the first drain; and
    means for measuring a current through the channel between the first source and the first drain.

17. The temperature sensor of claim 14, wherein the temperature sensor is embedded within at least one of an on-chip clock buffer, an IO driver, and a wordline driver.

18. The temperature sensor of claim 14, wherein the temperature sensor is employed in multilevel metallization.

19. A method for measuring the internal temperature of an integrated circuit having at least one field effect transistor (FET) having a source, a drain and a gate, and having a channel between the source and the drain, comprising the step of monitoring changes in sub-threshold leakage currents through the channel, wherein the temperature is extrapolated from the obtained leakage currents.

20. The method of claim 19, wherein the leakage currents are proportional to $$I = I_0(e^{(Vq/kT)} - 1)$$

where V is the applied voltage, T is the temperature, q is the electron charge, and $I_0$ is the saturation current.

21. The method of claim 19, further comprising the steps of:
    electrically isolating a first source of at least one FET from other components of the integrated circuit;
    electrically isolating a first drain of the at least one FET from other components of the integrated circuit;
    supplying a voltage to at least one of the first source and the first drain; and
    measuring a current through the channel between the first source and the first drain.

22. A temperature sensor for a multilevel metallization device, comprising means for monitoring changes in the current and the voltage of a metal finger of the multilevel metallization device, wherein the metal finger of the multilevel metallization device comprises a gate and is electrically isolated from other components of the multilevel metallization device, and wherein the changes in the current and voltage are used to calculate a change in resistance of the metal finger, and wherein the change in resistance of the metal finger is used to calculate a temperature change within the multilevel metallization device.

* * * * *